United States Patent [19]

Barter

[11] 4,241,296
[45] Dec. 23, 1980

[54] HORIZONTAL DEFLECTION CIRCUIT INCLUDING PROTECTION FOR OUTPUT TRANSISTOR

[75] Inventor: Archie M. Barter, Beaverton, Oreg.

[73] Assignee: Tektronix, Inc., Beaverton, Oreg.

[21] Appl. No.: 43,280

[22] Filed: May 29, 1979

[51] Int. Cl.³ ............................................. H01J 29/70
[52] U.S. Cl. ...................................... 315/397; 315/389
[58] Field of Search ........................ 315/397, 380, 389

[56] References Cited

U.S. PATENT DOCUMENTS

| 2,964,673 | 12/1960 | Stanley | 315/397 X |
| 3,426,245 | 2/1969 | Yurasek et al. | 315/389 |
| 3,786,303 | 1/1974 | Hilburn | 315/397 |
| 3,983,452 | 9/1976 | Bazin | 315/397 |
| 4,023,069 | 5/1977 | Peer | 315/397 |
| 4,096,416 | 6/1978 | Henley | 315/397 X |
| 4,164,688 | 8/1979 | Cushing | 315/389 |

*Primary Examiner*—Malcolm F. Hubler
*Attorney, Agent, or Firm*—William D. Haffner

[57] ABSTRACT

A circuit for driving and protecting the horizontal output transistor of a resonant raster scan display is disclosed. The driving circuitry described provides a circuit for separately establishing the currents required to turn a horizontal output transistor on and off. This transistor is turned on by a forward base current determined by beta requirements and turned off by a reverse base current equal to one half of the forward collector current. Protection against several common circuit failures is also incorporated in the circuit.

10 Claims, 2 Drawing Figures

HORIZONTAL DEFLECTION CIRCUIT INCLUDING PROTECTION FOR OUTPUT TRANSISTOR

BACKGROUND OF THE INVENTION

This invention relates to horizontal deflection amplifiers for resonant scan raster television displays. More specifically it relates to horizontal deflection output circuits which operate with horizontal drive inputs of various frequencies and also contain circuitry to protect the horizontal output transistor from certain types of failures.

It is common to drive the horizontal output transistor of a horizontal deflection circuit with a transformer as disclosed in U.S. Pat. No. 3,434,005 granted to E. J. Dreiske, et al. It is also known to drive the horizontal output transistor base with known currents; i.e., turn on current is determined by its beta requirements and turn off current is approximately equal to one half of the peak collector current. Separately establishing these currents assures a high efficiency transistor switch. This drive method was first discussed in the article "Horizontal Output Transistor Base Circuit Design" by R. J. Walker and R. Yu in *IEEE Transactions on Broadcast and Television Receivers*, Vol. BTR-20, No. 3, August 1974, pp. 185-192. However, a method of accurately establishing this current is not disclosed.

Various prior art techniques for protecting horizontal deflection circuits against various fault modes are known. These techniques generally protect against power supply and horizontal deflection faults as well as other faults which produce an effect in the power supply or horizontal deflection circuit. U.S. Pat. No. 4,042,858 granted to Collette, et al., for example, discloses a protection circuit which detects excessive current drain by a low voltage supply, excessive current drain by a high voltage, and excessive high voltage. If any one of these conditions is detected, the horizontal output transistor is disabled. Also, the previously mentioned patent granted to Dreiske, et al. discloses a circuit for protecting the output transistor against permanent damage that may occur because of failure of the high-voltage rectifiers.

Another failure mode which occurs in horizontal deflection systems and may cause permanent damage to the horizontal output transistor is failure of the horizontal oscillator or the horizontal drive transistor. Permanent damage may also occur if the output frequency of the horizontal oscillator is suddenly decreased. In the circuit described in the Dreiske, et al., for example, if the driver stage transistor is suddenly turned off for a long time, the voltage induced in the secondary winding of the horizontal output stage coupling transformer may cause the next flyback pulse to exceed the breakdown voltage of the horizontal output transistor. Conversely, if the horizontal driver transistor is suddenly turned on for a long time, the driver stage transistor and coupling transformer may be damaged.

SUMMARY OF THE INVENTION

In a horizontal deflection amplifier according to the present invention the horizontal output transistor is turned on by a forward base current determined by beta requirements and turned off by a reverse base current equal to one half of the forward collector current. Two Darlington transistors are used to switch the horizontal output transistor on and off according to the horizontal drive pulse. A monostable multivibrator is used to control the maximum on time of the horizontal output transistor.

It is therefore an object of the present invention to provide a novel method for driving a horizontal output transistor.

It is another object of the present invention to provide protection for the horizontal output transistor if the horizontal oscillator should fail.

Other objects and advantages of the present invention will become apparent to those having ordinary skill in the art upon a reading of the following description when taken in conjunction with the accompanying drawing figures wherein like reference numerals denote like elements.

DETAILED DESCRIPTION OF THE PREFERRED EMBODIMENTS

Figure 1:
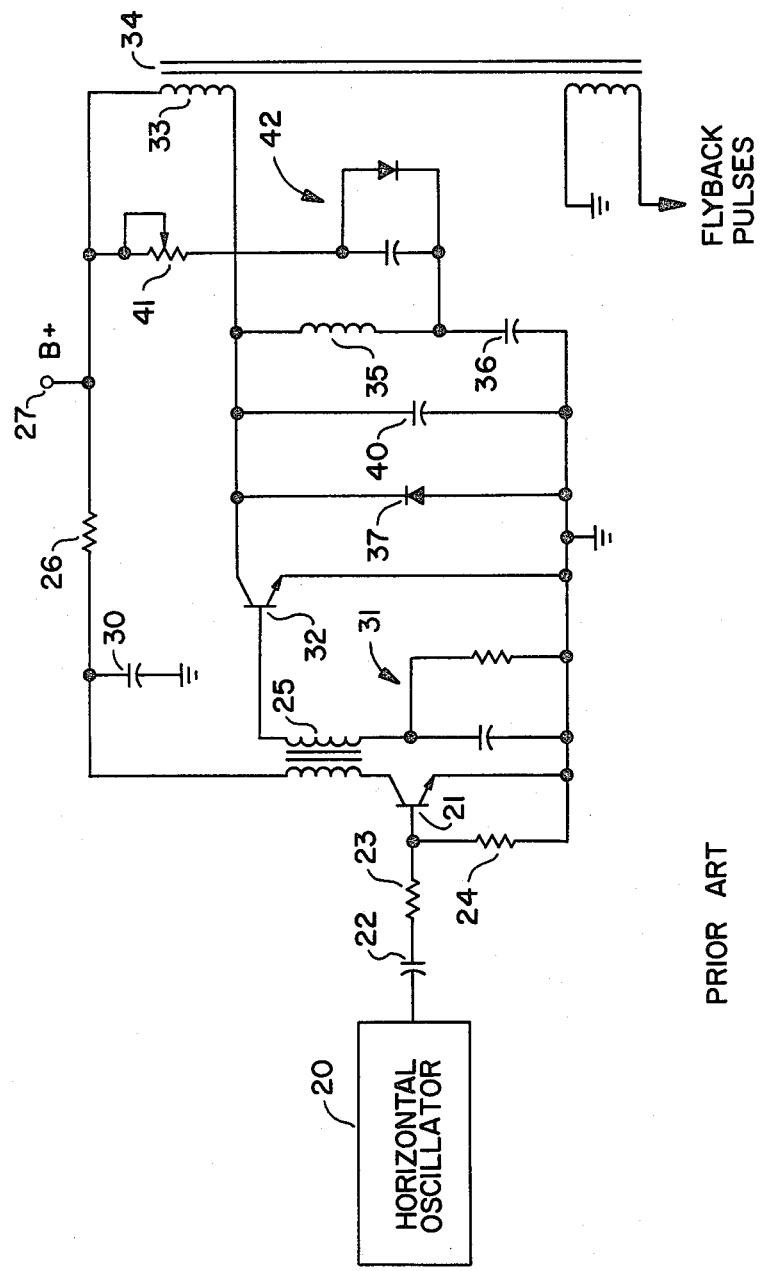
FIG. 1 is a schematic diagram of a prior art resonant sweep generator useful for explaining the advantages of the present invention.

Even though resonant sweep circuits are well known to those skilled in the art, the present invention may be better understood by referring to FIG. 1 wherein I have illustrated an example of the prior art. This resonant sweep circuit includes a horizontal oscillator 20 whose output is connected by capacitor 22 in series with resistor 23 to the base of horizontal drive transistor 21 which is connected by resistor 24 to ground. The emitter of transistor 21 is also connected to ground. The collector of transistor 21 is connected to the primary winding of a driver transformer 25 in series with resistor 26 to the B+ voltage source illustrated as terminal 27. The junction of the primary winding of transformer 25 and resistor 26 is connected by capacitor 30 to ground. The B+ voltage supply 27 is typically developed by rectification of the AC line voltage. Also, the B+ voltage is preferably regulated, for example, by a series regulator.

One end of the secondary winding of transformer 25 is connected by parallel RC circuit 31 to ground while the other end is connected to the base of horizontal output transistor 32. The emitter of transistor 32 is connected to ground and the collector is connected via the primary winding 33 of horizontal output or flyback transformer 34 to source 27.

Horizontal deflection yoke 35 has one end connected to the collector of transistor 32 while the other end is connected by S-shaping capacitor 36 to ground. Damper diode 37 and retrace capacitor 40 are each connected between ground and the collector of transistor 32. Source 27 is connected by horizontal centering control 41 and parallel connected diode and capacitor 42 to the junction of yoke 35 and capacitor 36 for biasing yoke 35.

In normal operation, pulses from oscillator 20 are coupled to the base of horizontal drive transistor 21 which drives output transistor 32 via transformer 25. At the start of the trace interval, diode 37 conducts current to yoke 35 to provide the first half of the trace signal. Transistor 32 is turned on before the end of the first half to provide the second half of the trace signal. At the end of the trace interval, transistor 32 is switched off to interrupt the current flow through yoke 35. Yoke 35 and capacitor 40 oscillate for one-half cycle to reverse the current flow through yoke 35 thereby providing horizontal retrace. Accordingly, capacitor 40 is selected to have a value such that yoke 35 and capacitor 40 resonate with a period twice the retrace interval. When transistor 32 is turned off, current flows through winding 33 thereby providing a horizontal output or flyback pulse in the secondary windings of transformer 34. Such flyback pulses are typically used for various purposes such as gating or timing pulses and for powering secondary power sources.

Figure 2:
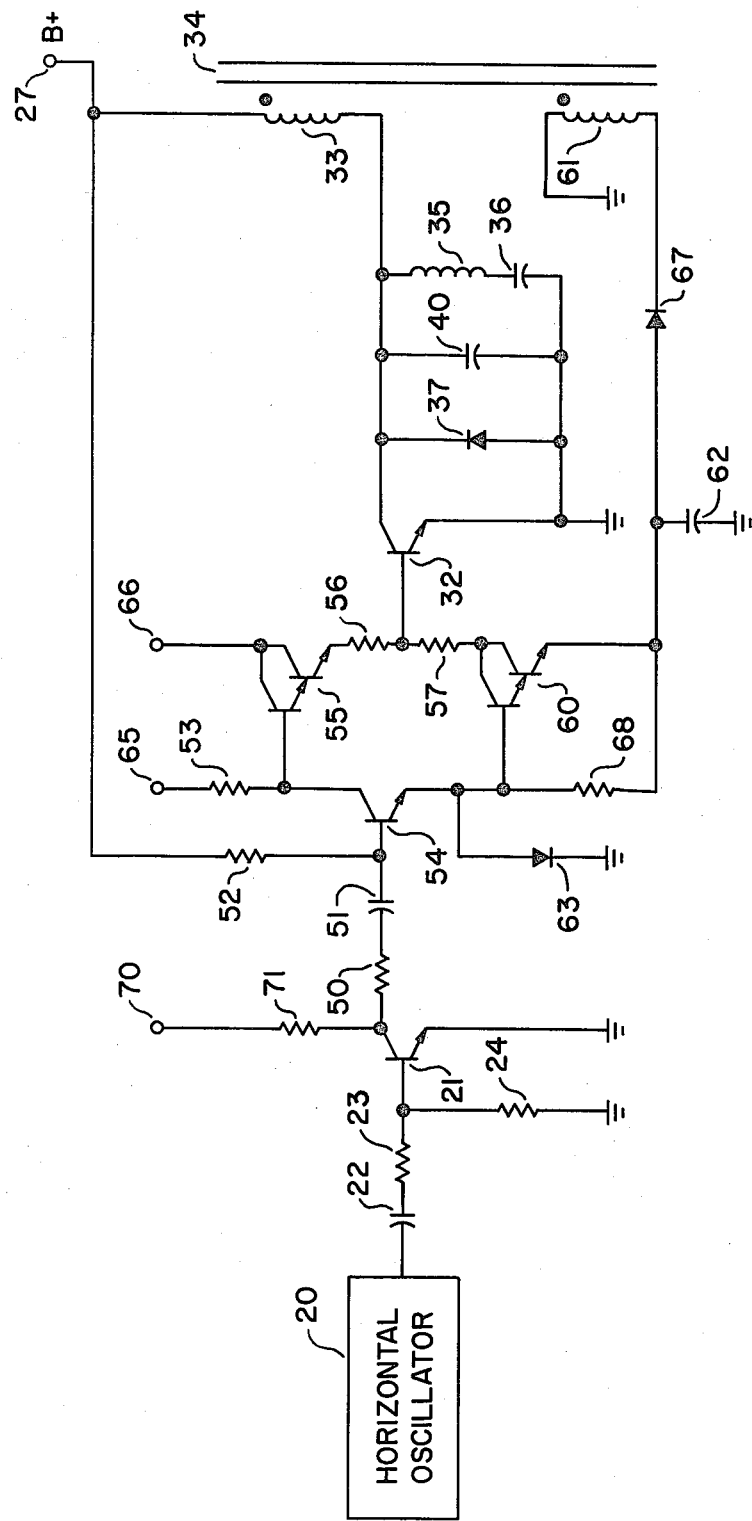
FIG. 2 is a schematic diagram of the present invention.

Refer now to FIG. 2 wherein I have illustrated an embodiment of my invention. The resonant sweep circuit according to my invention includes a horizontal oscillator 20 whose output is connected by capacitor 22 in series with resistor 23 to the base of horizontal drive transistor 21 which is connected by resistor 24 to ground. The emitter of transistor 21 is also connected to ground. The collector of transistor 21 is connected to the base of transistor 54 through resistor 50 and capacitor 51.

The base of transistor 54 is connected to primary winding 33 of flyback transformer 34 and B+ voltage source 27 by resistor 52. The collector of transistor 54 is connected through resistor 53 to a suitable positive power source 65 and to base of Darlington transistor 55. The emitter of transistor 54 is connected to ground, through diode 63; to the base of Darlington transistor 60; and to a suitable negative power source through resistor 68 comprised of secondary winding 61 of flyback transformer 34, diode 67, and capacitor 62 one plate of which is grounded.

The emitter of Darlington transistor 55 is connected through resistors 56 and 57 to the collector of Darlington transistor 60. The collector of Darlington transistor 55 is connected to a suitable positive power source 66 and the emitter of Darlington transistor 60 is connected to the previously-mentioned negative power source comprised of secondary winding 61, diode 67 and capacitor 62.

The junction of resistor 56 and resistor 57 is connected to the base of the horizontal output transistor 32. The emitter of transistor 32 is connected to ground and the collector is connected via the primary winding 33 of flyback transformer 34 to source 27.

Horizontal deflection yoke 35 has one end connected to the collector of transistor 32 while the other end is connected by S-shaping capacitor 36 to ground. Damper diode 37 and retrace capacitor 40 are each connected between ground and the collector of transistor 32.

By way of operation, the present invention operates essentially in the same manner as a standard horizontal deflection circuit such as that previously described. Therefore, the overall operation will not be described in detail again; only the novel circuit for driving and protecting the horizontal output transistor 32 will be described.

The horizontal output transistor is typically a triple diffused high voltage transistor. The operating characteristics of this type of transistor are described in the previously-mentioned journal article by Walker and Yu. In a switching application, such as a horizontal deflection circuit or high voltage power supply, in order to turn these transistors off the current must be swept out of the base region slowly. If the current is removed too quickly the switching efficiency of the transistor is reduced and, of course, power consumption increases.

In order to turn horizontal output transistor 32 on and off, the present invention includes a method for turning Darlington transistor 55 or Darlington transistor 60 on. These Darlingtons are used because of their high power gain. Resistor 56 is selected to provide the current necessary for turning transistor 32 on and resistor 57 is selected to provide the current necessary to turn off transistor 32. This makes positive power source 66 at the collector of Darlington transistor 55 independent of the negative power source at the emitter of Darlington transistor 60. Also a wide range of output voltages may be accomodated. Once the power supply voltages have been selected, then resistors 56 and 57 are selected according to the operating characteristics of horizontal output transistor 32. The value of resistor 56 is determined by the beta requirements of transistor 32 and the value of resistor 57 is determined by the peak collector current of transistor 32. The current through resistor 57 is set to be approximately one-half of the peak collector current just before flyback occurs.

Transistor 54, which drives the bases of Darlington transistors 55 and 60, is connected as a monostable multivibrator or one-shot. The output of oscillator 20 which feeds the base of transistor 54 is the horizontal drive signal and is typically a square wave. The falling edge of this signal will cause the deflection circuit to generate a trace. In other words, the falling edge turns off transistor 54, causing the voltage at its collector to rise and turns on Darlington transistor 55. The voltage at the base of transistor 32 causes it to conduct and increase the current in yoke 35. On the next or rising edge of the horizontal drive signal, transistor 54 turns on, Darlington transistor 55 turns off and Darlington transistor 60 turns on. In approximately 5-10 microseconds, horizontal output transistor 32 will turn off and flyback will begin. After flyback, diode 37 will conduct instead of horizontal output transistor 32. Also when transistor 32 is turned off, the current in resistor 57 drops to zero thus reducing power drain.

The previously mentioned protection feature of the present invention is provided by the one-shot multivibrator comprised of transistor 54, resistors 50 and 52, and capacitor 51. Capacitor 51 charges during the negative portion of the horizontal drive pulse. If the positive-going edge of the horizontal drive pulse does not occur before capacitor 51 charges to the voltage required to turn on transistor 54, the voltage on capacitor 51 will turn on transistor 54 and terminate the trace by turning off horizontal output transistor 32 in the previously described manner. The capacitance and resistance value of capacitor 51 and resistors 52 and 50 are selected for a maximum safe length of time to leave horizontal output transistor 32 on. When this time is exceeded at the horizontal drive input, transistor 32 will be turned off before its collector current has increased to a level that will cause collector-base voltage breakdown at its turn-off point. Prior art horizontal deflection systems typically terminate the trace in a failure mode such as that described above by abruptly removing the horizontal drive signal. This method may have catastrophic results.

At initial startup of the horizontal deflection system, transistor 54 is turned on through diode 63 to ground. This provides a low enough voltage at the base of transistor 55 to keep horizontal output transistor 32 off. However, once horizontal output transistor 32 has been turned on by the negative-going edge of the horizontal drive pulse, secondary winding 61 of flyback transformer 34 causes a negative voltage to appear at the cathode of diode 67. Diode 67 conducts and charges capacitor 62 to a large enough negative voltage to supply Darlington transistor 60. As long as the horizontal deflection circuit continues to operate, capacitor 62 remains negatively charged and diode 63 is reverse biased and effectively out of the circuit.

Accordingly, a novel circuit for driving and protecting the horizontal output transistor has been illustrated and described. The driving circuitry according to the present invention provides a simple method for determining the optimum base drive current in order to efficiently turn a horizontal output transistor on and off. The protection circuitry herein illustrated and described provides protection against several fault modes. While there has been shown and described a particular embodiment of the invention it will be obvious to those skilled in the art that various modifications may be made therein without departing from the appended claims.

A possible modification is, for example, to replace flyback transformer 34 with a coil and replace secondary winding 61, diode 67 and capacitor 62 with a separate negative power supply. Alternately, an additional secondary winding may be added to flyback transformer 34 for powering a high voltage power supply wherein the flyback pulses are typically rectified and multiplied. Another modification would be to add a variable current source to the base of transistor 54 and thereby increase or decrease the charging time of capacitor 51 in order to vary the on time of horizontal output transistor 32.

Therefore, I claim as my invention:

1. A circuit for controllably turning a transistor on and off according to the presence or absence of a base drive signal, the circuit comprising:
   a monostable multivibrator coupled to receive the base drive signal for producing an output pulse when the base drive signal is not received;
   a first switchable current source coupled to an output of said monostable multivibrator for supplying current to turn on the transistor, said first switchable current source having its output connected to the base electrode of the transistor;
   a second switchable current source coupled to an output of said monostable multivibrator for supplying current to turn off the transistor, said second switchable current source having its output connected to the base electrode of the transistor; and
   means for accurately and separately establishing said current to turn off the transistor and said current to turn on the transistor.

2. The electronic circuit according to claim 1 wherein said first switchable current source comprises a Darlington transistor.

3. The electronic circuit according to claim 1 wherein said second switchable current source comprises a Darlington transistor.

4. A horizontal deflection output circuit for a resonant raster scan display comprising:
   a horizontal output transistor;
   an oscillator for supplying horizontal drive signals to drive the deflection yoke of the resonant raster scan display;
   a driver transistor coupled to receive said horizontal drive signals;
   a monostable multivibrator coupled to said driver transistor for receiving said horizontal drive signals therefrom and producing an output pulse when said horizontal drive signals are not received;
   a first switchable current source coupled to an output of said monostable multivibrator for supplying current to turn on said horizontal output transistor, said first switchable current source having its output connected to the base electrode of said horizontal output transistor;
   a second switchable current source coupled to an output of said monostable multivibrator for supplying current to turn off said horizontal output transistor, said second switchable current source having its output connected to the base electrode of said horizontal output transistor; and
   means for accurately and separately establishing said current to turn off said horizontal output transistor and said current to turn on said horizontal output transistor.

5. The horizontal deflection output circuit according to claim 4 wherein said first switchable current source comprises a Darlington transistor.

6. The horizontal deflection output circuit according to claim 4 wherein said second switchable current source comprises a Darlington transistor.

7. The horizontal deflection output circuit according to claim 4 further comprising a flyback transformer for providing flyback pulses for powering auxillary circuitry.

8. A high voltage power supply circuit for providing focus electrode voltage for a resonant raster scan CRT, the circuit comprising:
   a horizontal output transistor;
   a flyback transformer having a primary winding and a plurality of secondary windings;
   a horizontal oscillator for supplying horizontal drive signals for driving said primary winding of said flyback transformer and inducing a flyback voltage in one of said plurality of secondary windings;
   a driver transistor for receiving said horizontal drive signals;
   a monostable multivibrator coupled to said driver transistor for receiving said drive signals therefrom and for producing an output pulse when said drive signals are not received;
   a first switchable current source coupled to an output of said monostable multivibrator for supplying current to turn on said horizontal output transistor, said first switchable current source having its output connected to the base electrode of said horizontal output transistor;
   a second switchable current source coupled to an output of said monostable multivibrator for supplying current to turn off said horizontal output transistor, said second switchable current source having its output connected to the base electrode of said horizontal output transistor; and
   means for accurately and separately establishing said current to turn off said horizontal output transistor and said current to turn on said horizontal output transistor.

9. The high voltage power supply circuit according to claim 8 wherein said first switchable current source comprises a Darlington transistor.

10. The high voltage power supply according to claim 8 wherein said second switchable current source comprises a Darlington transistor.

* * * * *